US010698017B2

(12) United States Patent
Chandra

(10) Patent No.: US 10,698,017 B2
(45) Date of Patent: Jun. 30, 2020

(54) TEST APPARATUS FOR SIGNAL INTEGRITY TESTING OF CONNECTORS

(71) Applicant: DELL PRODUCTS, L.P., Round Rock, TX (US)

(72) Inventor: Umesh Chandra, Santa Cruz, CA (US)

(73) Assignee: Dell Products, L.P., Round Rock, TX (US)

( * ) Notice: Subject to any disclaimer, the term of this patent is extended or adjusted under 35 U.S.C. 154(b) by 266 days.

(21) Appl. No.: 15/826,840

(22) Filed: Nov. 30, 2017

(65) Prior Publication Data

US 2019/0162768 A1 May 30, 2019

(51) Int. Cl.

| | |
|---|---|
| *G01R 31/28* | (2006.01) |
| *H05K 1/11* | (2006.01) |
| *G01R 29/26* | (2006.01) |
| *H01R 12/72* | (2011.01) |
| *H01R 12/73* | (2011.01) |
| *H01R 43/20* | (2006.01) |
| *H05K 1/02* | (2006.01) |
| *H05K 1/14* | (2006.01) |
| *H05K 3/36* | (2006.01) |
| *G01R 27/26* | (2006.01) |
| *H01R 12/57* | (2011.01) |
| *G01R 31/68* | (2020.01) |
| *G01R 31/69* | (2020.01) |
| *H01R 43/26* | (2006.01) |

(52) U.S. Cl.
CPC ......... *G01R 29/26* (2013.01); *G01R 27/2694* (2013.01); *G01R 31/68* (2020.01); *G01R 31/69* (2020.01); *H01R 12/57* (2013.01); *H01R 12/724* (2013.01); *H01R 12/73* (2013.01); *H01R 43/205* (2013.01); *H05K 1/0245* (2013.01); *H05K 1/111* (2013.01); *H05K 1/144* (2013.01); *H05K 3/368* (2013.01); *H01R 43/26* (2013.01); *H05K 1/117* (2013.01); *H05K 2201/093* (2013.01); *H05K 2201/09409* (2013.01); *H05K 2201/10151* (2013.01); *H05K 2201/10189* (2013.01); *H05K 2201/10356* (2013.01); *H05K 2203/162* (2013.01)

(58) Field of Classification Search
CPC .... G01R 31/043; G01R 31/045; H01R 12/57; H01R 12/73; H01R 12/724; H01R 43/26; H01R 43/205; H05K 1/111; H05K 1/115; H05K 1/117; H05K 1/144
See application file for complete search history.

(56) References Cited

U.S. PATENT DOCUMENTS

| | | | | |
|---|---|---|---|---|
| 4,636,919 A | * | 1/1987 | Itakura ................ | H05K 1/0289 174/261 |
| 10,154,581 B2 | * | 12/2018 | Becker ................ | H05K 1/0251 |
| 2016/0309576 A1 | | 10/2016 | Sharav et al. | |

* cited by examiner

*Primary Examiner* — Minh N Tang
(74) *Attorney, Agent, or Firm* — Isidore PLLC

(57) ABSTRACT

A test apparatus includes a host compliance printed circuit board having a first circuit plane and a second circuit plane separated by at least one dielectric layer. A first row of surface mount pads are disposed on the first circuit plane. The first row of surface mount pads includes a first pad and a second pad. A second and third row of surface mount pads are disposed on the first circuit plane. A first and second differential pair of circuit lines is disposed on the first circuit plane. The first differential circuit line has one end coupled to the first pad. The second differential circuit line has one end coupled to the second pad. The first and second differential pair of circuit lines extend from the first and second pads and between the second and third rows of surface mount pads.

19 Claims, 12 Drawing Sheets

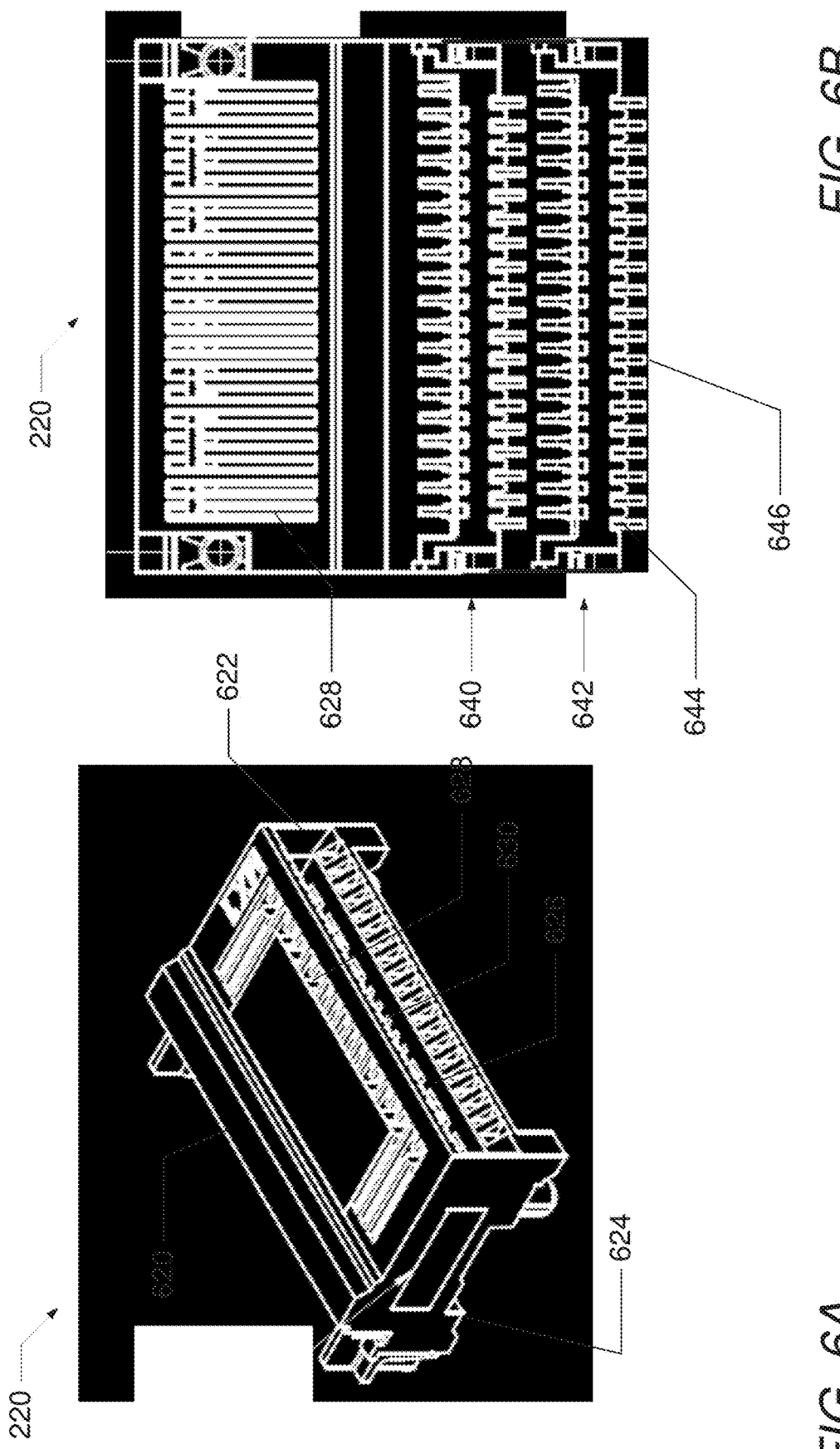

TEST APPARATUS FOR SIGNAL INTEGRITY TESTING OF CONNECTORS

BACKGROUND

1. Technical Field

The present disclosure generally relates to information handling systems and in particular to a test apparatus for signal integrity testing of connectors.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

An information handling system can include networking devices such as servers and switches. The servers and switches connect to fiber optic cables using quad small form-factor pluggable double density (QSFP DD) devices. The QSFP DD device is a hot-pluggable transceiver used for data communication applications. The QSFP DD device interfaces networking hardware (such as servers and switches) to a fiber optic cable or an electrical copper connection. Recent improvements in the density and capacity of QSFP DD devices have presented problems in accurately performing signal integrity measurements such as with cross-talk testing.

BRIEF SUMMARY

Disclosed are an information handling system (IHS), a test apparatus, and a method of manufacturing the test apparatus for signal integrity testing of connectors.

According to one embodiment, an IHS comprises a test apparatus for signal integrity testing of connectors that includes a host compliance printed circuit board having a first circuit plane and a second circuit plane separated by at least one dielectric layer. A first row of surface mount pads are disposed on the first circuit plane. The first row of surface mount pads includes a first pad and a second pad. A second row of surface mount pads are disposed on the first circuit plane and spaced from the first row of surface mount pads. A third row of surface mount pads are disposed on the first circuit plane and spaced from the first row of surface mount pads and the second row of surface mount pads. A first and second differential pair of circuit lines is disposed on the first circuit plane. The first differential circuit line has one end coupled to the first pad. The second differential circuit line has one end coupled to the second pad. The first and second differential pair of circuit lines extend from the first and second pads and between the second and third rows of surface mount pads. The first and second differential pair of circuit lines further extend beyond the second and third rows of surface mount pads.

Also disclosed is a test apparatus for signal integrity testing of connectors. The test apparatus includes a host compliance printed circuit board having a first circuit plane and a second circuit plane separated by at least one dielectric layer. A first row of surface mount pads are disposed on the first circuit plane. The first row of surface mount pads includes a first pad and a second pad. A second row of surface mount pads are disposed on the first circuit plane and spaced from the first row of surface mount pads. A third row of surface mount pads are disposed on the first circuit plane and spaced from the first row of surface mount pads and the second row of surface mount pads. A first and second differential pair of circuit lines is disposed on the first circuit plane. The first differential circuit line has one end coupled to the first pad. The second differential circuit line has one end coupled to the second pad. The first and second differential pair of circuit lines extend from the first and second pads and between the second and third rows of surface mount pads. The first and second differential pair of circuit lines further extend beyond the second and third rows of surface mount pads.

According to one embodiment, a test apparatus for signal integrity testing of quad small form-factor pluggable double density (QSFP DD) connectors is disclosed. The QSFP DD connector has two rows of lead frames that are spaced a physical distance apart. A host compliance printed circuit board (HCPCB) plugs into the QSFP DD connector. The HCPCB has two rows of surface mount (SMT) pads. The QSFP DD connector is mounted to test printed circuit board (TPCB). When fully inserted into the QSFP DD connector, the first row of SMT pads connects to a first row of lead frames. The second row of SMT pads connects to a second row of lead frames. This configuration is double sided, with lead frames and SMT pads on both the top and bottom surfaces of the HCPCB being connected to the lead frames. There are four differential pairs of circuit lines coupled to each row of lead frames. The top surface of HCPCB has a total of eight differential pairs of circuit lines and the bottom surface of HCPCB has a total of eight differential pairs of circuit lines. HCPCB has first, second, and third rows of SMT pads that are coupled to lead frames. Four of the differential pair of circuit lines on each surface are routed between the second and third rows of SMT pads. In total, sixteen differential pairs of circuit lines are routed through HCPCB to SMT connectors for signal integrity testing.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which:

FIG. 6A illustrates a perspective view of a quad small form-factor pluggable double density (QSFP DD) connector, according to one or more embodiments;

FIG. 6B illustrates a bottom view of the QSFP DD connector of FIG. 6A, according to one or more embodiments;

DETAILED DESCRIPTION

Figure 1:
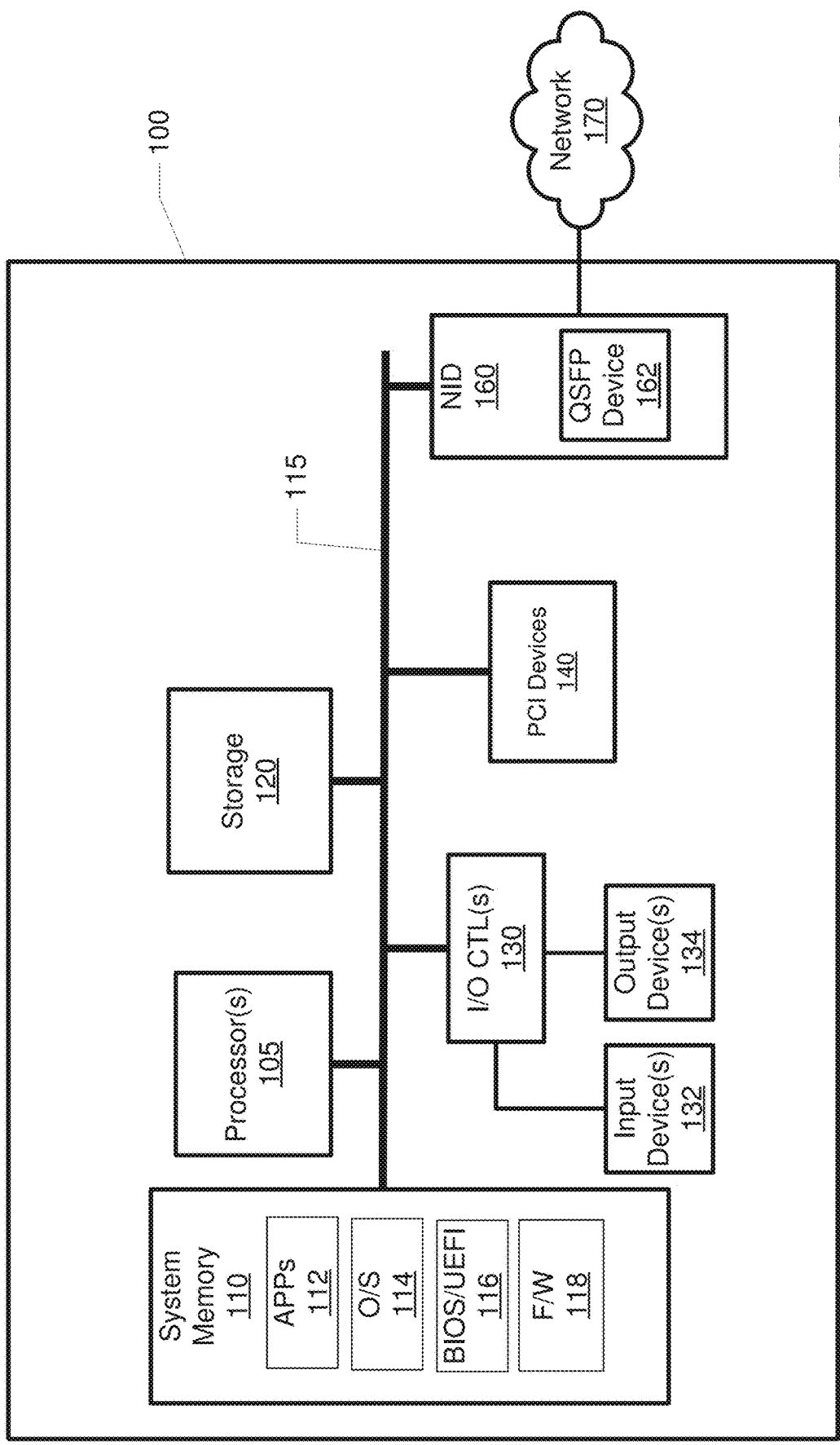
FIG. 1 illustrates an example information handling system within which various aspects of the disclosure can be implemented, according to one or more embodiments.

The illustrative embodiments provide an information handling system (IHS), a test apparatus for signal integrity testing of connectors, and a method of manufacturing a test apparatus for signal integrity testing of connectors. The test apparatus includes a host compliance printed circuit board having a first circuit plane and a second circuit plane separated by at least one dielectric layer. A first row of surface mount pads are disposed on the first circuit plane. The first row of surface mount pads includes a first pad and a second pad. A second row of surface mount pads are disposed on the first circuit plane and spaced from the first row of surface mount pads. A third row of surface mount pads are disposed on the first circuit plane and spaced from the first row of surface mount pads and the third row of surface mount pads. A first and second differential pair of circuit lines is disposed on the first circuit plane. The first differential circuit line has one end coupled to the first pad. The second differential circuit line has one end coupled to the second pad. The first and second differential pair of circuit lines extend from the first and second pads and between the second and third rows of surface mount pads. The first and second differential pair of circuit lines further extend beyond the second and third rows of surface mount pads. The routing of the differential circuit lines between the second and third rows of surface mount pads allows for accurate testing of signal integrity and cross talk noise of quad small form-factor pluggable double density (QSFP DD) connectors that have multiple rows of surface mount contacts.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

FIG. 1 illustrates a block diagram representation of an example information handling system (IHS) 100, within which one or more of the described features of the various embodiments of the disclosure can be implemented. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring specifically to FIG. 1, example IHS 100 includes one or more processor(s) 105 coupled to system memory 110 via system interconnect 115. System interconnect 115 can be interchangeably referred to as a system bus, in one or more embodiments. Also coupled to system interconnect 115 is storage 120 within which can be stored one or more software and/or firmware modules and/or data (not specifically shown). In one embodiment, storage 120 can include one or more hard drives or solid state drives that are mounted within a system enclosure as will be described below. The one or more software and/or firmware modules within storage 120 can be loaded into system memory 110 during operation of IHS 100. As shown, system memory 110 can include therein a plurality of software and/or firmware modules including application(s) 112, operating system (O/S) 114, basic input/output system (BIOS) 116 and firmware (F/W) 118.

In one or more embodiments, BIOS 116 comprises additional functionality associated with unified extensible firmware interface (UEFI), and can be more completely referred to as BIOS/UEFI in these embodiments. The various software and/or firmware modules have varying functionality when their corresponding program code is executed by processor(s) 105 or other processing devices within IHS 100.

IHS 100 further includes one or more input/output (I/O) controllers 130 which support connection by, and processing of signals from, one or more connected input device(s) 132, such as a keyboard, mouse, touch screen, or microphone. I/O controllers 130 also support connection to and forwarding of output signals to one or more connected output devices 134, such as a monitor or display device or audio speaker(s) or light emitting diodes (LEDs). Additionally, in one or more embodiments, system interconnect 115 is further coupled to peripheral component interconnect (PCI) devices 140. PCI devices 140 can include modems, network cards, sound cards, video cards, shared memory, solid state drives and other hardware devices.

IHS 100 further comprises a network interface device (NID) 160. NID 160 enables IHS 100 to communicate and/or interface with other devices, services, and components that are located external to IHS 100. In one embodiment, NID 160 can include quad small form factor pluggable double density (QSFP DD) device 162. QSFP DD device 162 is a hot-pluggable transceiver used for data communications. The QSFP DD device can interface IHS 100 to fiber optic cables or active or passive electrical copper connections. These devices, services, and components can interface with IHS 100 via an external network, such as example network 170, using one or more communication protocols.

Network 170 can be a local area network, wide area network, personal area network, and the like, and the connection to and/or between network 170 and IHS 100 can be wired or wireless or a combination thereof. For purposes of discussion, network 170 is indicated as a single collective component for simplicity. However, it is appreciated that network 170 can comprise one or more direct connections to other devices as well as a more complex set of interconnections as can exist within a wide area network, such as the Internet.

Figure 2:
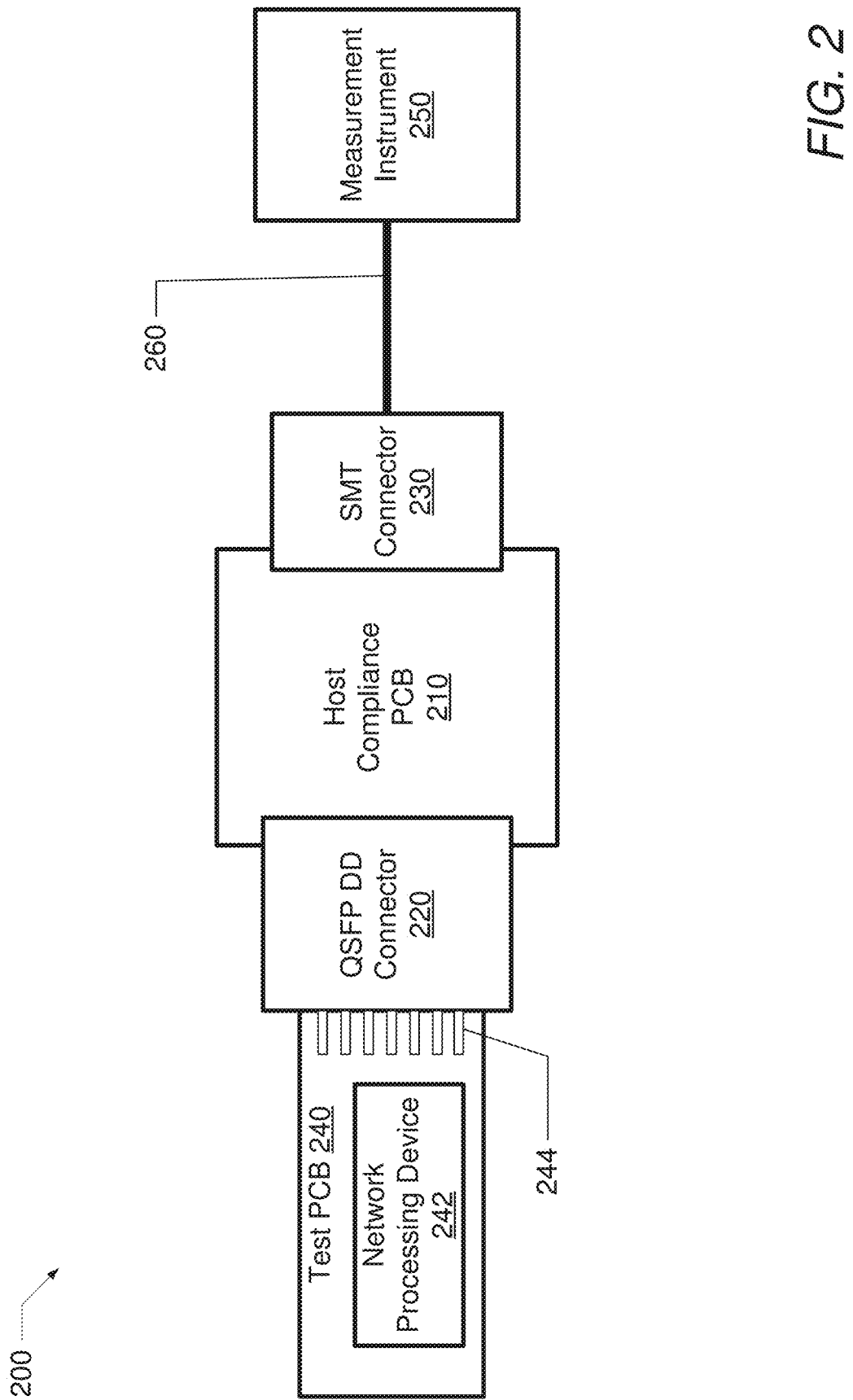
FIG. 2 illustrates a block diagram of a test apparatus for an information handling system, according to one or more embodiments.

In the discussion of the following figures, the description of each figure can include general reference to the specific components illustrated within the preceding figures. Turning to FIG. 2, a test apparatus 200 is shown. Test apparatus 200 can be used to test at least one circuit of IHS 100. In one embodiment, NID 160 can include QSFP DD device 162. Test apparatus 200 can be used to test the QSFP DD device 162 and specifically the QSFP DD connector 220 for various signal integrity parameters such as cross-talk noise, return loss, insertion loss, reflections and jitter.

Test apparatus 200 includes a host compliance printed circuit board (HCPCB) 210, a QSFP DD connector 220, a surface mount (SMT) connector 230, test printed circuit board (TPCB) 240 and a measurement instrument 250. HCPCB 210 is a multi-layer printed circuit board with various ground planes, circuit lines, pads, plated through holes and vias. QSFP DD connector 220 is mounted to TPCB 240 and SMT connector 230 is mounted or coupled to HCPCB 210. In one embodiment, SMT connector 230 can be a SMT compression connector, such as a multi-coax connector that is commercially available from Ardent Concepts Inc. of Seabrook, N.H. TPCB 240 includes one or more rows of SMT pads 244 that are located on the top surface of TPCB 240.

TPCB 240 includes a network processing device 242 that is mounted to TPCB 240. In one embodiment, network processing device 242 can be a network processing unit, which is an integrated circuit programmable for use as a network architecture component inside a network application domain. Network processing device 242 can be optimized to handle the routing and processing of data packets. Several sub-miniature A coaxial (SMA) cables 260 electrically connect the SMT connector 230 to measurement instrument 250. Measurement instrument 250 can be a variety of electrical measurement instruments such as an oscilloscope or a network analyzer. In one embodiment, test apparatus 200 can be used to test QSFP DD connector 220 for various signal integrity parameters such as cross-talk noise, return loss, insertion loss, reflections and jitter.

Figure 3:
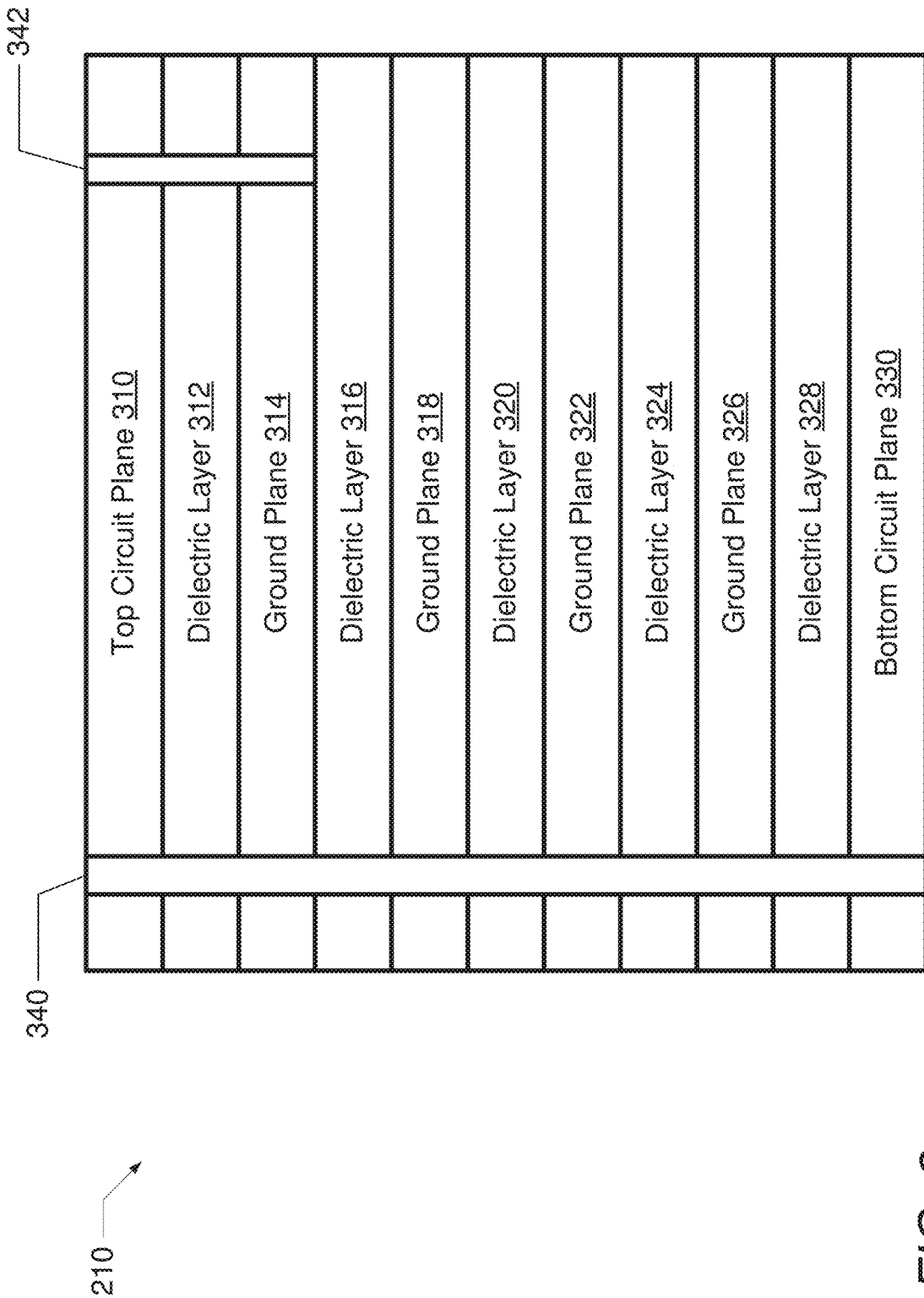
FIG. 3 illustrates a cross-sectional view of a host compliance printed circuit board, according to one or more embodiments.

With reference now to FIG. 3, the various layers of HCPCB 210 are shown. HCPCB 210 includes a top circuit plane 310 that is mounted over a dielectric layer 312. HCPCB 210 includes a plurality of dielectric layers 312, 316, 320, 324, 328 interspersed between pairs of ground planes 314, 318, 322, and 326. Ground plane 314 is located below dielectric layer 312 and above dielectric layer 316. Ground plane 318 is located below dielectric layer 316 and above dielectric layer 320. Ground plane 322 is located below dielectric layer 320 and above dielectric layer 324. Ground plane 326 is located below dielectric layer 324 and above dielectric layer 328. Bottom circuit plane 330 is mounted below dielectric layer 328. In one embodiment, the circuit planes and ground planes are formed from copper and the dielectric layers are formed from fiberglass epoxy resin. HCPCB 210 can further include one or more plated through holes 340 and vias 342. Plated through holes 340 can extend between top circuit plane 310 and bottom circuit plane 330 in order to route electrical signals between the top and bottom circuit planes. Vias 342 can extend from either top circuit plane 310 and/or bottom circuit plane 330 to one or more ground planes in order to provide a ground connection.

Figure 4A:
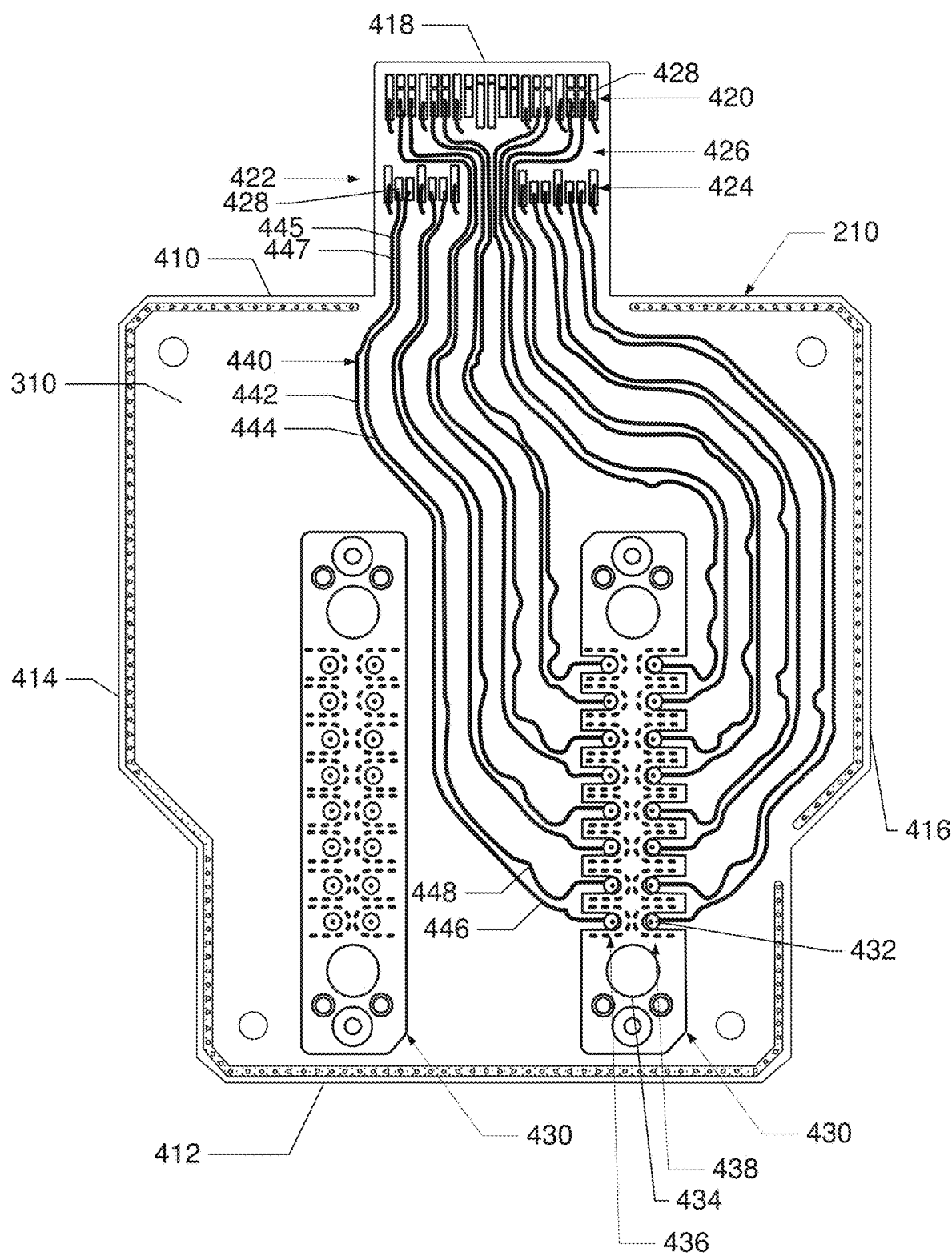
FIG. 4A illustrates a top view of a host compliance printed circuit board, according to one or more embodiments.
Figure 5A:
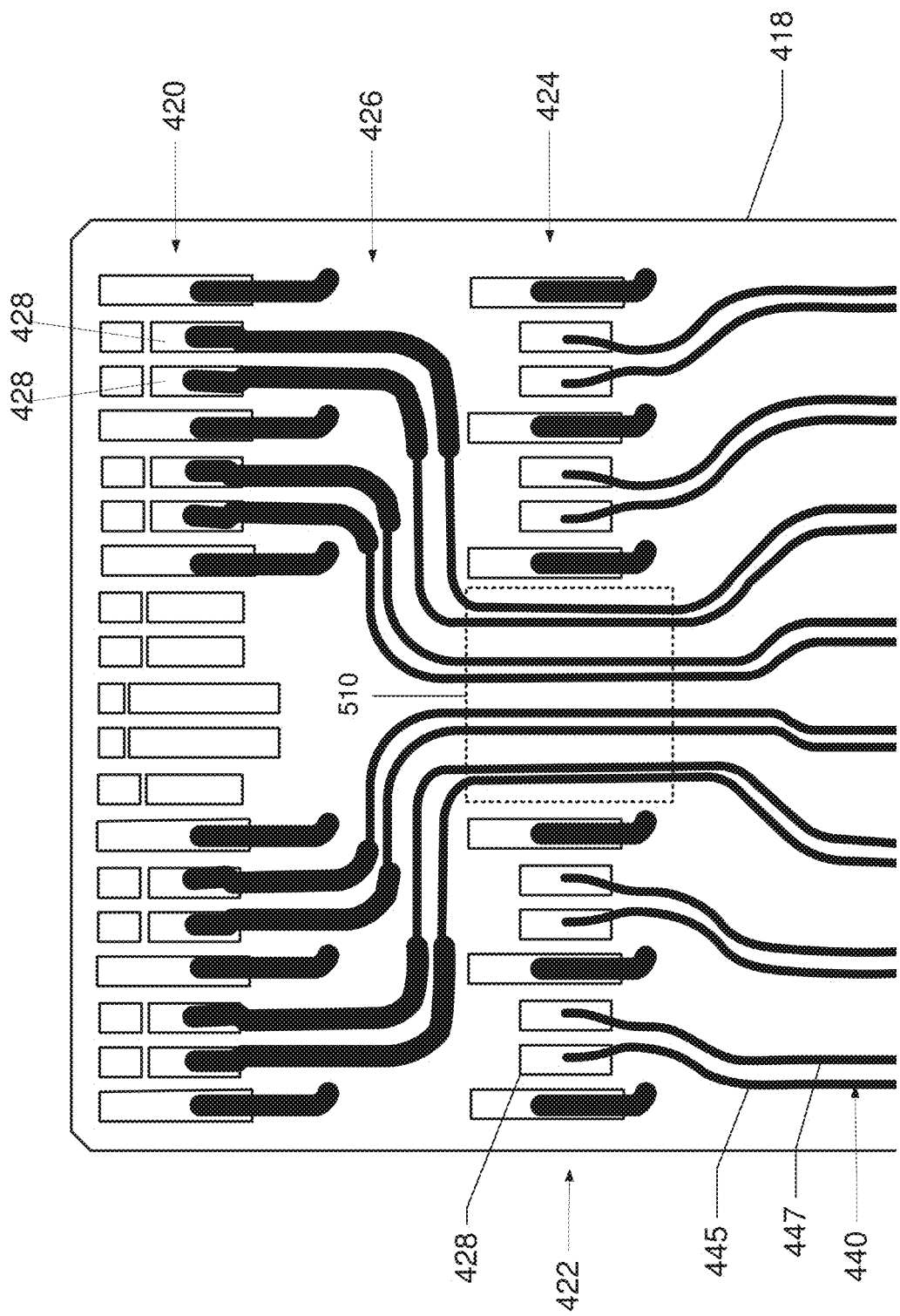
FIG. 5A illustrates an enlarged top view of one end of the host compliance printed circuit board, according to one or more embodiments.

Referring to both FIGS. 4A and 5A, top and enlarged views of HCPCB 210 illustrating details of top circuit plane 310 are shown. HCPCB 210 has a top end 410, bottom end 412 and sides 414 and 416. A tongue 418 extends away from top end 410. Top circuit plane 310 includes three rows of surface mount pads 428, a first group or row 420, a second group or row 422 and a third group or row 424 of surface mount pads 428. The first row 420 is separated from the second 422 and third rows 424 by a space 426. Two connector mounting areas 430 are defined on top circuit plane 310. Connector mounting areas 430 are adapted to each receive and attach SMT connector 230. Connector mounting areas 430 include connector SMT pads 432 and screw holes 434. SMT pads 432 are arranged in rows 436 and 438. SMT connector 230 (FIG. 2) is attached to HCPCB 210 using screws (not shown) that are received in screw holes 434. SMT connector 230 mates with connector SMT pads 432 in order to establish an electrical connection between the SMT connector 230 and HCPCB 210.

Several differential pair circuit lines 440 are located on top circuit plane 310. Differential pair circuit lines 440 include circuit line 442 and circuit line 444. Circuit line 442 has ends 445 and 446, and circuit line 444 has ends 447 and 448. End 445 is connected to one of the surface mount pads 428 in second row 422 and end 446 is connected to one of the connector SMT pads 432. End 447 is connected to one of the surface mount pads 428 in second row 422 and end 448 is connected to one of the connector SMT pads 432.

The differential pair circuit lines 440 that are coupled to the surface mount pads 428 in first row 420 extend and are routed through routing area 510 (FIG. 5A) between second row 422 and third row 424 of surface mount pads 428. The routing of differential pair circuit lines 440 through routing area 510 allows differential pair signals from QSFP DD connector 220 (FIG. 2) to be routed to SMT connector 230 (FIG. 2).

The differential pair circuit lines of FIGS. 4A and 5A provide for differential signaling. Differential signaling is a method for electrically transmitting information using two complementary signals. The same electrical signal is sent as a differential pair of signals, each in its own conductor. The pair of conductors can be circuit lines on a circuit board. The receiving circuit responds to the electrical difference between the two signals, rather than the difference between a single wire and ground.

Figure 4B:
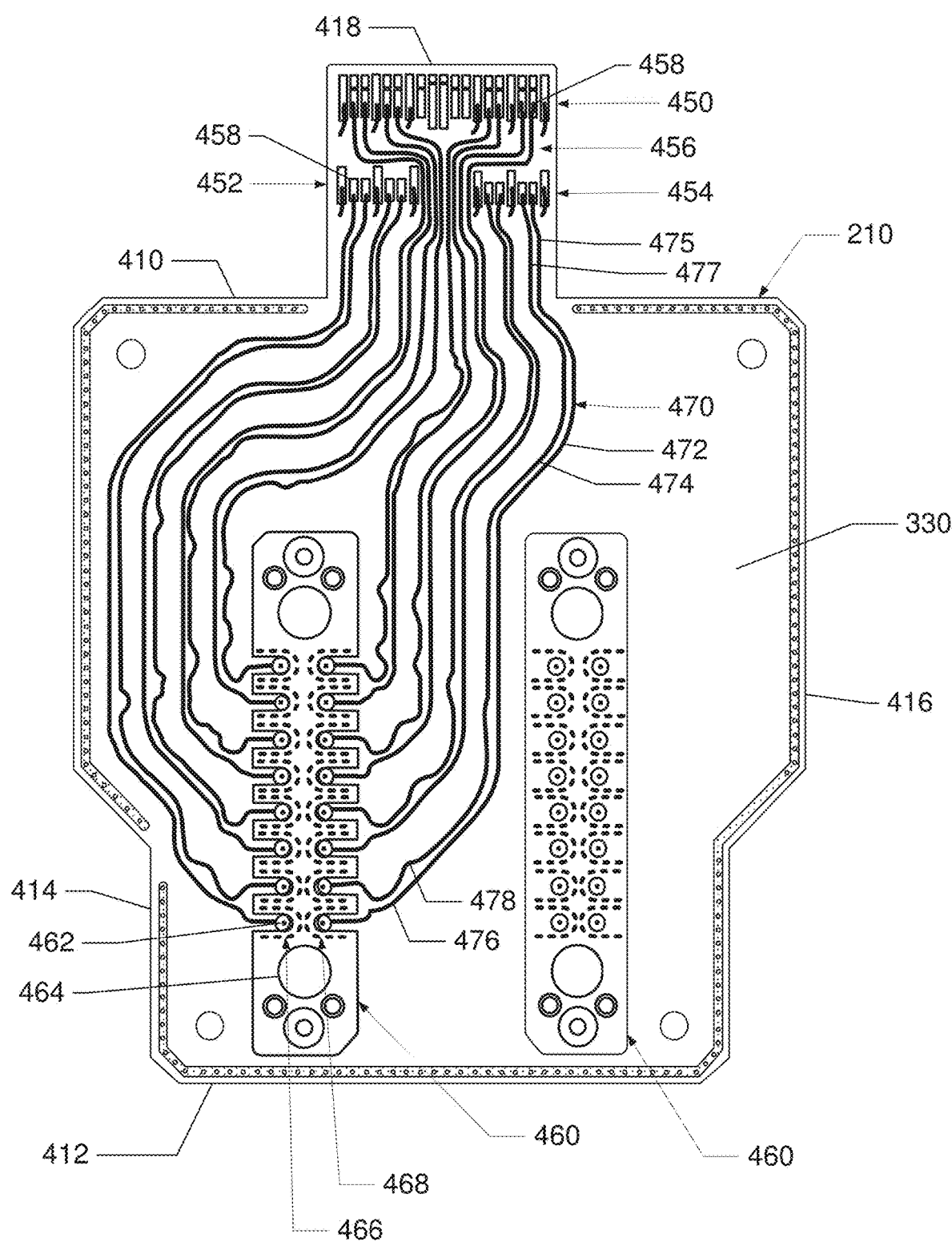
FIG. 4B illustrates a bottom view of a host compliance printed circuit board, according to one or more embodiments.
Figure 5B:
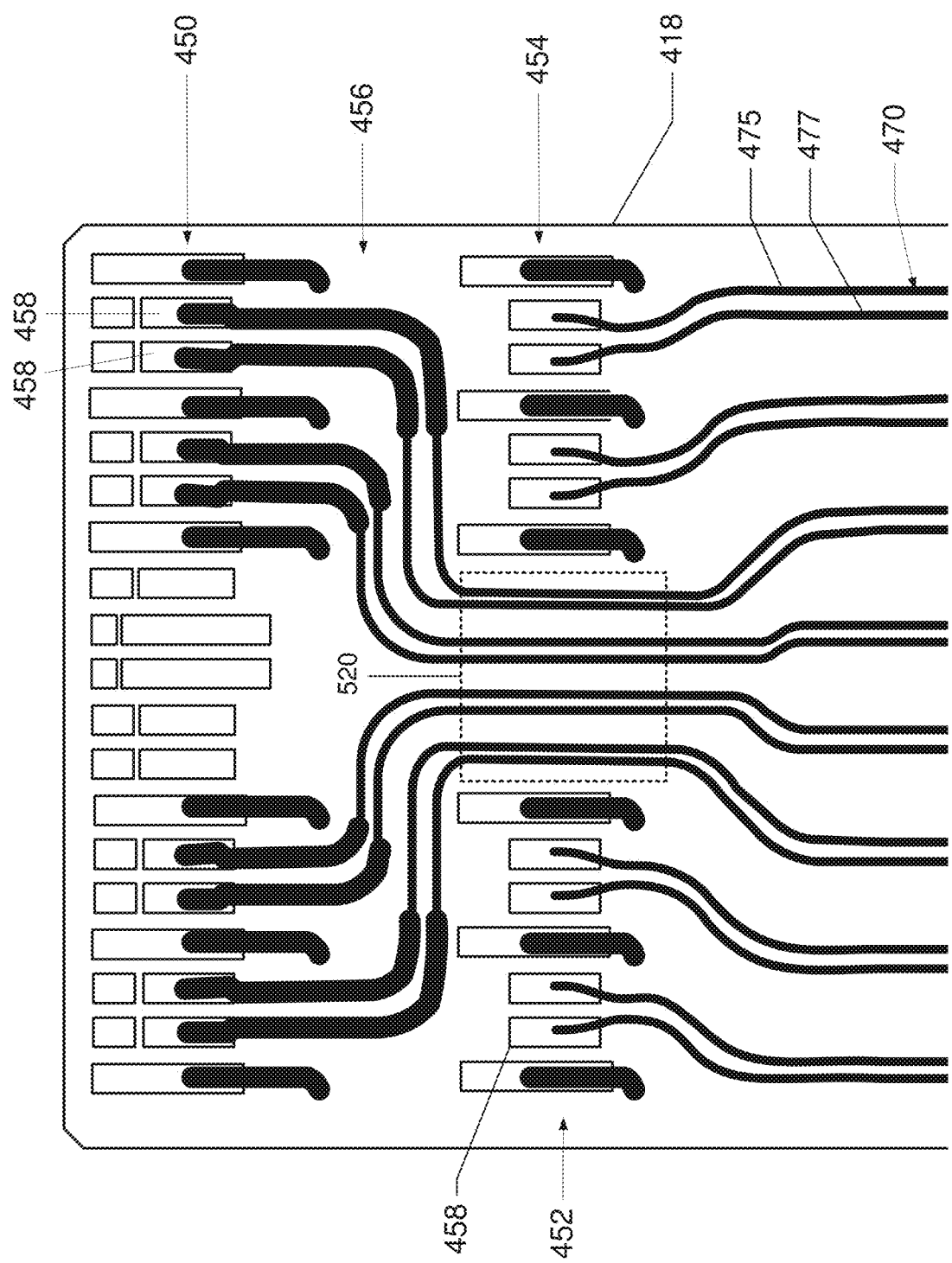
FIG. 5B illustrates an enlarged bottom view of one end of the host compliance printed circuit board, according to one or more embodiments.

Referring to both FIGS. 4B and 5B, top and enlarged views of HCPCB 210 illustrating details of bottom circuit plane 330 are shown. Bottom circuit plane 330 includes three rows of surface mount pads 458, a first group or row 450, a second group or row 452 and a third group or row 454 of surface mount pads 458. The first row 450 is separated from second row 452 and third row 454 by a space 456. Two connector mounting areas 460 are defined on bottom circuit plane 330. Connector mounting areas 460 are adapted to each receive and attach another SMT connector 230 (FIG. 2). Connector mounting areas 460 include connector SMT pads 462 and screw holes 464. SMT pads 462 are arranged in rows 466 and 468. SMT connector 230 is attached to HCPCB 210 using screws (not shown) that are received in screw holes 464. SMT connector 230 mates with connector SMT pads 462 in order to establish an electrical connection between the SMT connector 230 and HCPCB 210.

Several differential pair circuit lines 470 are located on bottom circuit plane 330. Differential pair circuit lines 470 include circuit line 472 and circuit line 474. Circuit line 472 has ends 475 and 476, and circuit line 474 has ends 477 and 478. End 475 is connected to one of the surface mount pads 458 in third row 454 and end 476 is connected to one of the connector SMT pads 462. End 477 is connected to one of the surface mount pads 458 in third row 454 and end 448 is connected to one of the connector SMT pads 462.

The differential pair circuit lines 470 that are coupled to the surface mount pads 458 in first row 450 extend and are routed through routing area 520 (FIG. 5B) between the second row 452 and third row 454 of surface mount pads 458. The routing of differential pair circuit lines 470 through routing area 520 allows differential pair signals from QSFP DD connector 220 (FIG. 2) to be routed to SMT connector 230 of FIG. 2.

FIG. 6A illustrates details of QSFP DD connector 220. QSFP DD connector 220 includes a body 620 that has a front side 622 and a bottom side 624. A slot 626 extends along front side 622. Slot 626 is dimensioned to receive tongue 418 of HCPCB 210. Several lead frames 628 are located within body 620. With additional reference to FIG. 6B, additional details of QSFP DD connector 220 are shown. Each of the lead frames 628 have one end 630 located within slot 626 and another end 644 that terminates at connector pads 646 on the bottom side 624. The connector pads 646 are arranged in a first row 640 and a second row 642 of connector pads. QSFP DD connector 220 is mounted to TPCB 240 with the connector pads 646 configured to be attached to SMT pads 244 using conventional electrical assembly techniques such as soldering.

Figure 6C:
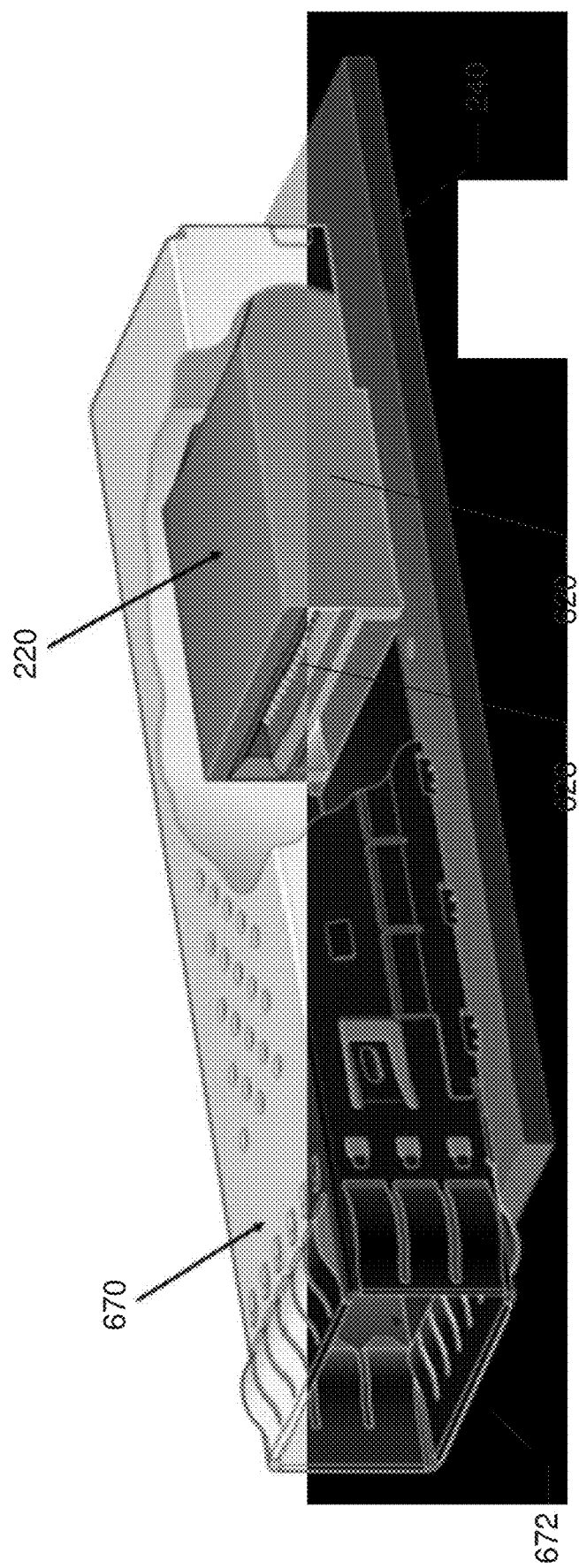
FIG. 6C illustrates a perspective view of a QSFP DD connector mounted to a test printed circuit board, according to one or more embodiments.

Turning to FIG. 6C, QSFP DD connector 220 is shown mounted to TPCB 240. The connector pads of QSFP DD connector 220 are attached to the SMT pads 244 on the top surface of TPCB 240 using conventional electrical assembly techniques such as soldering. A metal electromagnetic interference (EMI) cage 670 is mounted to TPCB 240 and surrounds QSFP DD connector 220. EMI cage 670 has a cavity 672 that receives the tongue 418 of HCPCB 210 (FIG. 2). EMI cage 670 surrounds tongue 418 when tongue 418 is mounted in slot 626.

Figure 6D:
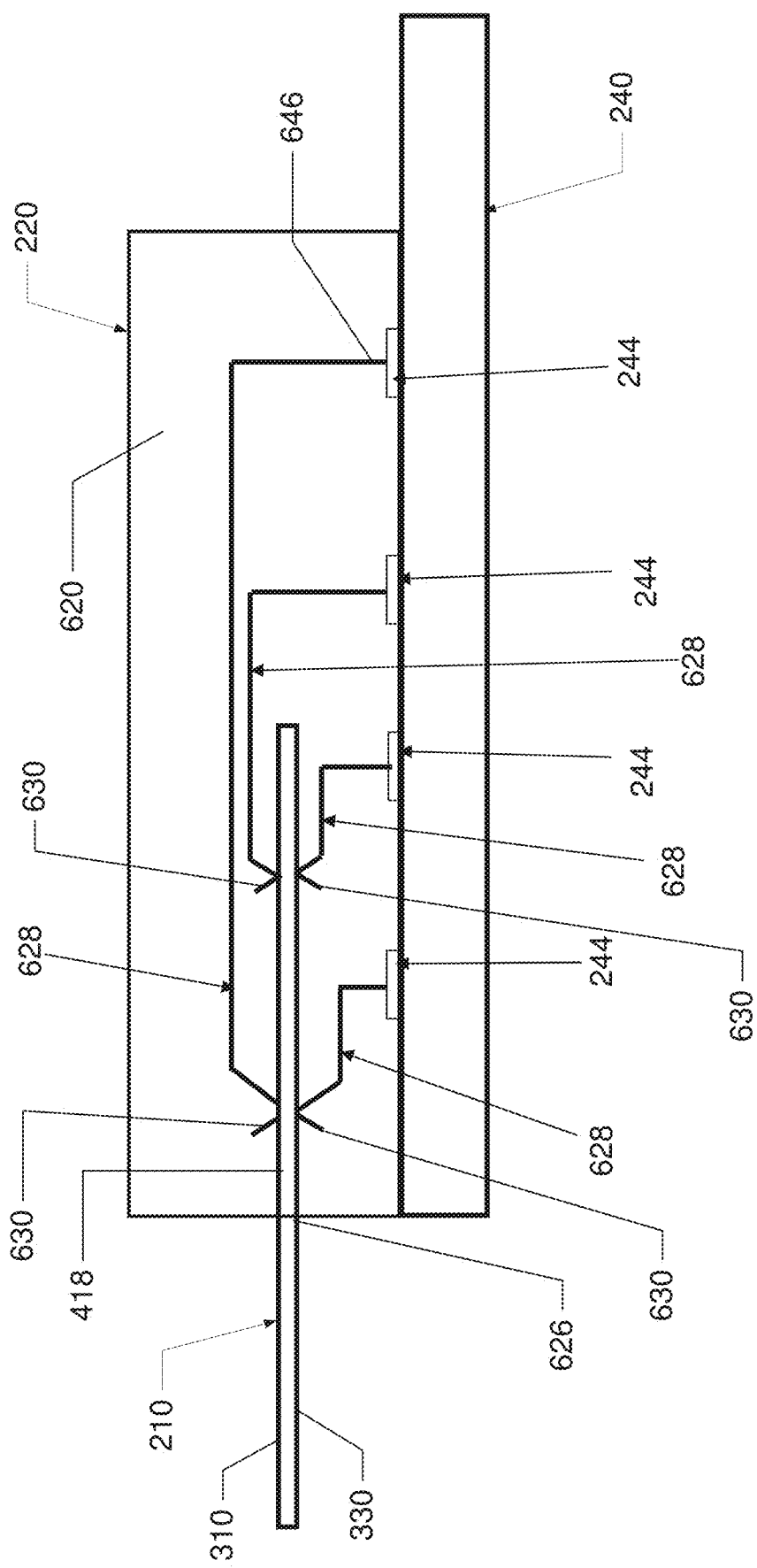
FIG. 6D illustrates a cross-sectional view of a QSFP DD connector mounted to a test printed circuit board with a host compliance printed circuit board inserted into the QSFP DD connector, according to one or more embodiments.

Referring to FIG. 6D, QSFP DD connector 220 is shown mounted to TPCB 240 with HCPCB 210 inserted into QSFP DD connector 220. Tongue 418 is located in slot 626. The connector pads 646 of QSFP DD connector 220 are attached to the SMT pads 244 of TPCB 240 using conventional electrical assembly techniques such as soldering. The QSFP DD connector 220 has two rows of lead frames 628 that are spaced a physical distance apart. HCPCB 210 plugs into the QSFP DD connector 220. HCPCB 210 has rows (420, 422 and 424) (FIG. 5A) of surface mount pads 428. The QSFP DD connector 220 is mounted to TPCB 240. When fully inserted into QSFP DD connector 220, first row 420 of surface mount pads 428 of HCPCB 210 connects to ends 630 of a first row of lead frames 628. The second row 422 and third row 424 of surface mount pads 428 of HCPCB 210 connect to ends 630 of a second row of lead frames 628.

According to one embodiment, a test apparatus 200 for signal integrity testing of QSFP DD connectors 220 is disclosed. The QSFP DD connector 220 has two rows of lead frames 628 that are spaced a physical distance apart. HCPCB 210 plugs into the QSFP DD connector 220. HCPCB 210 has rows (420, 422 and 424) of surface mount pads 428. The QSFP DD connector 220 is mounted to TPCB 240. When fully inserted into the QSFP DD connector 220, the first row 420 of surface mount pads 428 of HCPCB 210 connects to a first row of lead frames 628. The second row 422 and third row 424 of surface mount pads 428 of HCPCB 210 connect to a second row of lead frames 628. This configuration is double sided, with lead frames and surface mount pads on both the top and bottom surfaces of HCPCB 210 being connected to the lead frames. There are four differential pairs of circuit lines coupled to each row of lead frames 628. The top surface 310 of HCPCB 210 has a total of eight differential pairs of circuit lines 440 and the bottom surface 330 of HCPCB 210 has a total of eight differential pairs of circuit lines 470. HCPCB 210 has first 420, second 422 and third 424 rows of surface mount pads 428 that are coupled to lead frames 628. Four of the differential pair of circuit lines on each surface are routed between second row 422 and third row 424 of SMT pads 428. In total, sixteen differential pairs of circuit lines are routed through HCPCB 210 to SMT connectors 230 for signal integrity testing.

Figure 7:
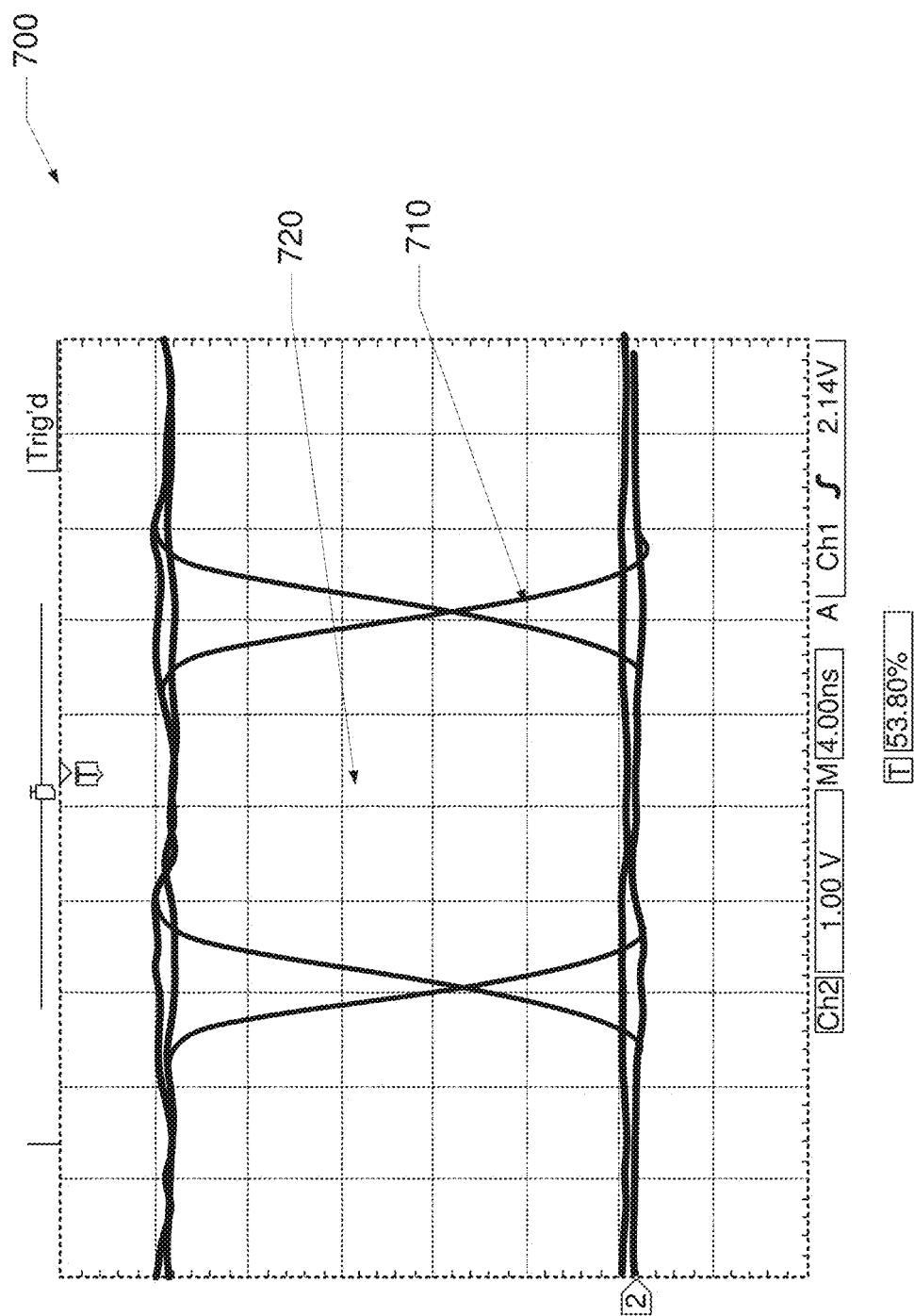
FIG. 7 illustrates an eye diagram of a signal integrity measurement for a QSFP DD connector, according to one or more embodiments.

FIG. 7 illustrates an eye diagram 700 that is generated by measurement instrument 250 during signal integrity testing of QSFP DD connector 220 and the electrical path between network processing device 242 and measurement instrument 250. Eye diagram 700 is generated by measurement instrument 250 and includes several signals 710 and an eye area 720. An eye diagram is an oscilloscope display in which a digital signal is repetitively sampled and applied to the vertical input, while the data rate is used to trigger the horizontal sweep. It is called an eye diagram because, for several types of signals, the pattern looks like a series of eyes between a pair of rails. An eye diagram is a tool for the evaluation of the combined effects of channel noise and inter-symbol interference on the performance of a baseband pulse-transmission system. It is the synchronized superposition of all possible realizations of the signal of interest viewed within a particular signaling interval. Several signal integrity system performance measures can be derived by analyzing the display. The eye diagram enables one to discern from observation of the generated patterns whether/when the signals are too long, too short, poorly synchronized with the system clock, too high, too low, too noisy, or too slow to change, or have too much undershoot or overshoot. An open eye pattern corresponds to minimal signal distortion. Distortion of the signal waveform due to inter-symbol interference and noise appears as closure of the eye pattern.

In one embodiment, eye diagram 700 can be used to determine if the cross-talk noise values (signal integrity) for differential pair signals being carried via QSFP DD connector 220 are within an acceptable range or are not within an acceptable range. Eye diagram 700 is generated by overlaying sweeps of different segments of a long data stream that travel through QSFP DD connector 220. Positive and negative pulses are superimposed on each other to produce the eye diagram. In an ideal eye diagram, the eye area 720 would have the shape of a rectangular box. In reality, because of cross-talk noise, impedance mismatches and time delay, the signals do not line up perfectly on top of each other and the eye area 720 takes on a more oval shape with many non-overlapping lines which indicate distortion of the signal at least partially caused by cross-talk noise within QSFP DD connector 220.

Figure 8:
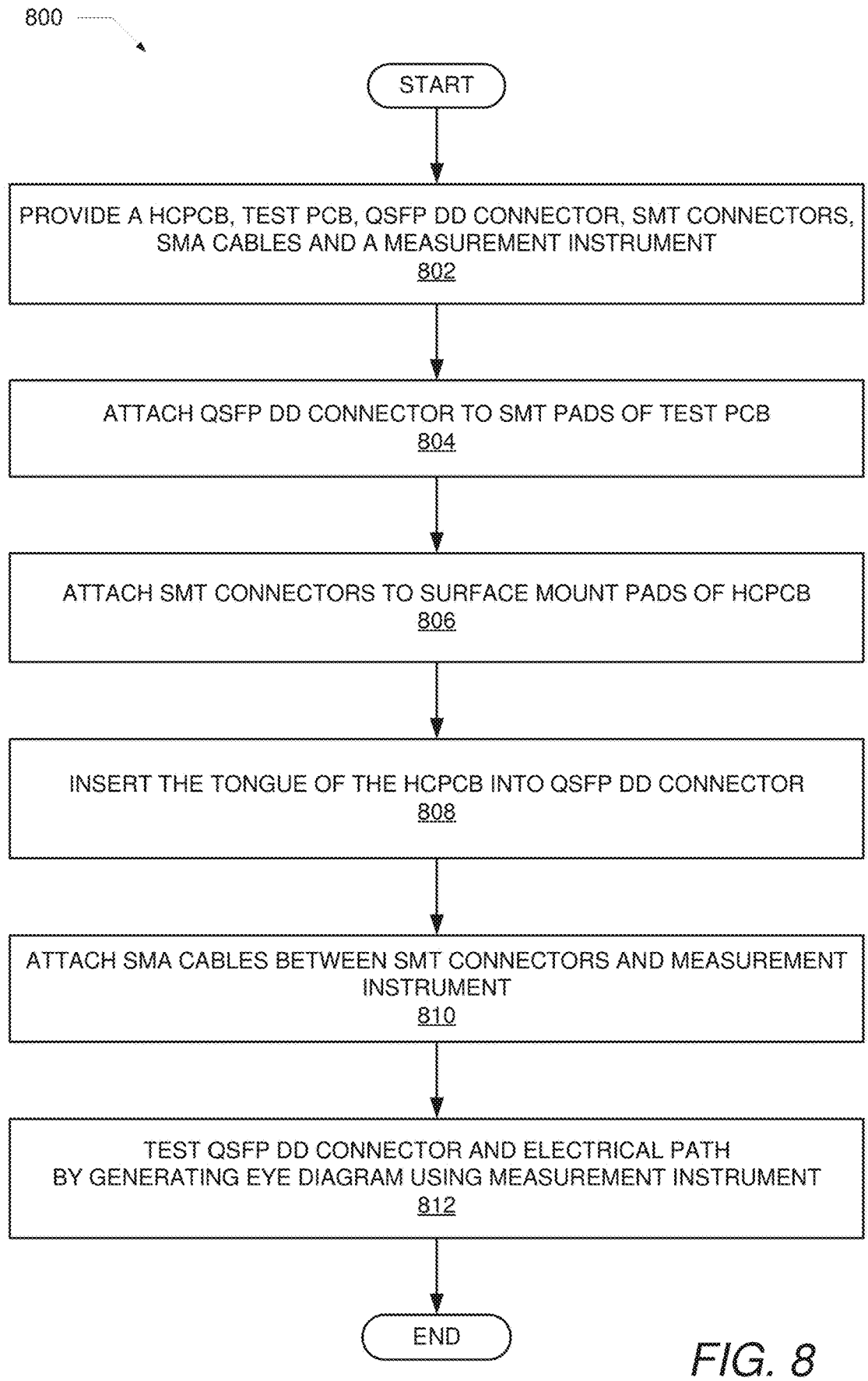
FIG. 8 is a flow chart illustrating an example of a method of manufacturing a test apparatus for signal integrity testing of connectors, according to one or more embodiments.

FIG. 8 illustrates a flowchart of an exemplary method 800 for manufacturing test apparatus 200 of the preceding figures. The description of the method is provided with general reference to the specific components illustrated within the preceding FIGS. 1-7. With specific reference to FIG. 8, method 800 begins at the start block and proceeds to block 802 where HCPCB 210, QSFP DD connector 220, SMT connectors 230, TPCB 240, SMA cables 260 and measurement instrument 250 are provided. QSFP DD connector 220 is mounted to SMT pads 244 of TPCB 240 (block 804) using an attachment technique such as soldering. SMT connectors 230 are mounted to rows 436, 438 and 466, 468 of surface mount pads 432 and 462 on HCPCB 210 (block 806) by screwing the SMT compression connectors to HCPCB 210 using screws that are received by screw holes 434.

Tongue 418 of HCPCB 210 is inserted into slot 626 of QSFP DD connector 220 (block 808) such that the surface mount pads 428 and 458 are engaged with ends 630 of lead frames 628. TPCB 240 includes network processing device 242. One end of the SMA cables 260 are attached to the SMT connector 230 and the other end of the SMA cables 260 are connected to the measurement instrument 250 (block 810). The QSFP DD connector and electrical path are tested using the measurement instrument 250 (block 812). In one embodiment, measurement instrument 250 can test the QSFP DD connector and electrical path by generating eye diagram 700 in order to determine if the QSFP DD connector has an acceptable level of noise during operation that will not cause false signal to be registered at network processing device 242. Method 800 concludes at the end block.

In the above described flow chart, one or more of the methods may be embodied in a computer readable medium containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. An information handling system comprising:
    one or more processor(s);
    a system memory coupled to the one or more processors via a system interconnect;
    a test apparatus for signal integrity testing of connectors, the test apparatus comprising:
        a host compliance printed circuit board having a first circuit plane and a second circuit plane separated by at least one dielectric layer;
        a first row of surface mount pads disposed on the first circuit plane, the first row of surface mount pads including a first pad and a second pad;
        a second row of surface mount pads disposed on the first circuit plane and spaced from the first row of surface mount pads;
        a third row of surface mount pads disposed on the first circuit plane and spaced from the first row of surface mount pads and the second row of surface mount pads; and
        a first and second differential pair of circuit lines disposed on the first circuit plane, the first differential circuit line having one end coupled to the first pad, the second differential circuit line having one end coupled to the second pad, the first and second differential pair of circuit lines extending from the first and second pads and between the second and third rows of surface mount pads, the first and second differential pair of circuit lines further extending beyond the second and third rows of surface mount pads; and
    a quad small form factor pluggable double density (QSFP DD) connector coupled to the first, second and third rows of surface mount pads.

2. The information handling system of claim 1, further comprising:
    a fourth row of surface mount pads disposed on the first circuit plane and spaced from the second and third rows of surface mount pads, the fourth row of surface mount pads including a third pad and a fourth pad, the first and second differential pair of circuit lines further extending from between the second and third rows of surface mount pads to the fourth row of surface mount pads.

3. The information handling system of claim 2, further comprising:
    the first differential circuit line further having another end coupled to the third pad and the second differential circuit line further having another end coupled to the fourth pad.

4. The information handling system of claim 1, further comprising:
    a test printed circuit board coupled to the QSFP DD connector; and a network processing device coupled to the test printed circuit board.

5. The information handling system of claim 1, further comprising:
a compression connector coupled to the fourth row of surface mount pads; and
a plurality of sub-miniature cables coupled to the compression connector.

6. The information handling system of claim 5, further comprising:
a measurement instrument coupled to the sub-miniature cables, the measurement instrument configured to test at least one test parameter of the QSFP DD connector.

7. The information handling system of claim 6, wherein the at least one test parameter is an eye diagram.

8. The information handling system of claim 1, wherein the host compliance printed circuit board further comprises:
a first ground plane;
a second ground plane;
a first dielectric layer located between the first and second ground planes;
a third dielectric layer located between the first ground plane and the first circuit plane; and
a fourth dielectric layer located between the second ground plane and the second circuit plane.

9. The information handling system of claim 1, wherein the DSFP DD connector is of a DSFP DD device within a network interface device of the information handling system.

10. A test apparatus for signal integrity comprising:
a host compliance printed circuit board having a first circuit plane and a second circuit plane separated by at least one dielectric layer;
a first row of surface mount pads disposed on the first circuit plane, the first row of surface mount pads including a first pad and a second pad;
a second row of surface mount pads disposed on the first circuit plane and spaced from the first row of surface mount pads;
a third row of surface mount pads disposed on the first circuit plane and spaced from the first row of surface mount pads and the second row of surface mount pads; and
a first and second differential pair of circuit lines disposed on the first circuit plane, the first differential circuit line having one end coupled to the first pad, the second differential circuit line having one end coupled to the second pad, the first and second differential pair of circuit lines extending from the first and second pads and between the second and third rows of surface mount pads, the first and second differential pair of circuit lines further extending beyond the second and third rows of surface mount pads; and
a quad small form factor pluggable double density (QSFP DD) connector coupled to the first, second and third rows of surface mount pads.

11. The test apparatus of claim 10, further comprising:
a fourth row of surface mount pads disposed on the first circuit plane and spaced from the second and third rows of surface mount pads, the fourth row of surface mount pads including a third pad and a fourth pad, the first and second differential pair of circuit lines further extending from between the second and third rows of surface mount pads to the fourth row of surface mount pads.

12. The test apparatus of claim 11, further comprising:
the first differential circuit line further having another end coupled to the third pad and the second differential circuit line further having another end coupled to the fourth pad.

13. The test apparatus of claim 10, further comprising:
a test printed circuit board coupled to the QSFP DD connector; and
a network processing device coupled to the test printed circuit board.

14. The test apparatus of claim 10, further comprising:
a compression connector coupled to the fourth row of surface mount pads; and
a plurality of sub-miniature cables coupled to the compression connector.

15. The test apparatus of claim 14, further comprising:
a measurement instrument coupled to the sub-miniature cables, the measurement instrument configured to test at least one test parameter of the QSFP DD connector.

16. The test apparatus of claim 15, wherein the at least one test parameter is an eye diagram.

17. The test apparatus of claim 10, wherein the host compliance printed circuit board further comprises:
a first ground plane;
a second ground plane;
a first dielectric layer located between the first and second ground planes;
a third dielectric layer located between the first ground plane and the first circuit plane; and
a fourth dielectric layer located between the second ground plane and the second circuit plane.

18. A method of manufacturing a test apparatus, the method comprising:
providing a host compliance printed circuit board having a first circuit plane including a first row of surface mount pads, a second row of surface mount pads and a third row of surface mount pads disposed on the first circuit plane, the first row of surface mount pads including a first pad and a second pad, the host compliance board further including a first differential pair of circuit lines having first ends coupled to the first pad and second ends coupled to a fourth row of surface mount pads;
coupling second ends of a second differential pair of circuit lines to the second pad, the first and second differential pair of circuit lines extending from the first and second pads, respectively, and between the second and third rows of surface mount pads, the first and second differential pair of circuit lines further extending beyond the second and third rows of surface mount pads;
mounting a compression connector to the fourth row of surface mount pads; and
inserting the host compliance printed circuit board into a quad small form factor pluggable double density (QSFP DD) connector, the QSFP DD connector being mounted to a test printed circuit board and coupled to the first, second and third rows of surface mount pads.

19. The method of claim 18, further comprising:
attaching a plurality of sub-miniature cables to the compression connector; and
connecting a measurement instrument to the sub-miniature cables, the measurement instrument configured to test the QSFP DD connector.

* * * * *

UNITED STATES PATENT AND TRADEMARK OFFICE
CERTIFICATE OF CORRECTION

PATENT NO. : 10,698,017 B2  
APPLICATION NO. : 15/826840  
DATED : June 30, 2020  
INVENTOR(S) : Umesh Chandra Page 1 of 1

It is certified that error appears in the above-identified patent and that said Letters Patent is hereby corrected as shown below:

In the Claims

Column 13, Line 28, Claim 9, after "the" delete "DSFP".  
Column 13, Line 28, Claim 9, after "is of a" delete "DSFP".  
Column 13, Line 28, Claim 9, after "the" insert --QSFP--.  
Column 13, Line 28, Claim 9, after "is of a" insert --QSFP--.

Signed and Sealed this  
Ninth Day of March, 2021

Drew Hirshfeld  
*Performing the Functions and Duties of the*  
*Under Secretary of Commerce for Intellectual Property and*  
*Director of the United States Patent and Trademark Office*